United States Patent [19]

Nakagawara

[11] Patent Number: 5,293,514
[45] Date of Patent: Mar. 8, 1994

[54] INTEGRATING FILTER CIRCUIT

[75] Inventor: Chikashi Nakagawara, Kanagawa, Japan

[73] Assignee: Kabushiki Kaisha Toshiba, Kanagawa, Japan

[21] Appl. No.: 903,486

[22] Filed: Jun. 24, 1992

[30] Foreign Application Priority Data

Jun. 28, 1991 [JP] Japan ................................. 3-159181

[51] Int. Cl.$^5$ .......................... H03K 5/22; H03K 5/00
[52] U.S. Cl. .................................. 307/494; 328/127; 307/521
[58] Field of Search ............... 307/494, 520, 521, 523, 307/526; 328/127, 167

[56] References Cited

U.S. PATENT DOCUMENTS

| | | | |
|---|---|---|---|
| 4,888,502 | 12/1989 | Jarrett | 307/521 |
| 4,996,498 | 2/1991 | Hanna. | |
| 5,039,890 | 8/1991 | Jasberg et al. | 307/520 |

FOREIGN PATENT DOCUMENTS

| | | |
|---|---|---|
| 0426594A2 | 5/1991 | European Pat. Off. . |
| 2931525 | 2/1981 | Fed. Rep. of Germany . |
| 62-225024 | 10/1987 | Japan . |

OTHER PUBLICATIONS

Electronics Letters, vol. 26, No. 13, Jun. 1990, Enage GB, pp. 880-881, by B. Stefanelli et al., "CMOS Triode Transconductor with High Dynamic Range".

Primary Examiner—Jin F. Ng
Assistant Examiner—Sinh Tran
Attorney, Agent, or Firm—Finnegan, Henderson, Farabow, Garrett & Dunner

[57] ABSTRACT

An integrating filter circuit having a reference potential source for supplying the integrating filter circuit with a prescribed reference potential, a transconductance circuit provided with a differential circuit, a variable current source couple to the differential circuit and output means coupled to the differential circuit for outputting an intermediate voltage of the outputs of the differential circuit, a common feedback loop with a comparison circuit coupled between the output means and the variable current source so as to stabilize the intermediate voltage in reference to a reference voltage supplied to the comparison circuit and capacitors coupled between the variable current source and the reference potential source.

9 Claims, 2 Drawing Sheets

INTEGRATING FILTER CIRCUIT

FIELD OF THE INVENTION

The present invention relates generally to an integrating filter circuit, and more particularly, to an integrating filter circuit suitable for fabricating in IC devices.

BACKGROUND OF THE INVENTION

Various integrating filter circuits suited for incorporation into IC devices have been developed. Conventionally, these integrating filter circuits have utilized an integrating circuit comprised of transconductance circuits and capacitors, and a feedback technique for causing a desired filtering characteristic.

In a physical embodiment of the integrating filter circuit the integrating characteristic usually deviates from an ideal integrating characteristic. Such a deviation largely affects the integrating filter characteristic of the circuit. Thus it has been tried to bring the integration characteristic of integrating circuits close to the ideal integration characteristic by operating the integrating circuits with a fully differential circuit configuration. In such a differential circuit configuration, a common feedback technique is required to stabilize a differential operation.

FIG. 1 shows an example of such conventional integrating filter circuit utilizing the fully differential circuit configuration and the common feedback technique.

In FIG. 1, a capacitor C1 is connected in a transconductance circuit 10 consisting of a differential circuit 10A formed by transistors Q1 and Q2. The emitters of the transistors Q1 and Q2 are connected together, and then the common emitter node connected to a current source I1. The bases of the transistors Q1 and Q2 are coupled to input terminals IN for receiving an input signal. The collectors of the transistors Q1 and Q2 thus operate as current output ends. The collectors of the transistors Q1 and Q2 are connected not only to the collectors of transistors Q3 and Q4, but also to the bases of transistors Q6 and Q7. The transistors Q3, Q4, Q6 and Q7 construct a variable current source 10B as described later. The transistors Q6 and Q7 are arranged in an emitter-follower circuit configuration with current sources I2 and I3 connected to their emitters, respectively. The emitters of the transistors Q6 and Q7 are connected together through two series resistors R1 and R2 with a same resistance value.

The connecting node 10C of the resistors R1 and R2 is coupled to one input of a comparison circuit 20 comprised of transistors Q8 and Q9 which are arranged in a differential circuit configuration with a current source I4. For example, the voltage on the connecting node 10C, which represents an intermediate voltage Vi of the outputs of the differential circuit voltage, is applied to the base of the transistor Q8. The other input of the comparison circuit 20, i.e., the base of the other transistor Q9 is coupled to a source of the reference voltage Vref. Thus the intermediate voltage Vi of the outputs of the transconductance circuit 10 is compared with the reference voltage Vref at the comparison circuit 20.

A current resulted from the comparison in the comparison circuit 20 is applied to an integrating capacitor C2 which is connected to the collector of the transistor Q9. Thus an integrated voltage resulting from the integration by the integrating capacitor C2 is fed back to the transconductance circuit 10 through the transistors Q3 and Q4 of the variable current source 10B. As a result, the operating point of the transconductance circuit 10, i.e., the intermediate voltage Vi is stabilized by the common feedback operation via the connecting node 10C of the resistors R1 and R2 in the variable current source 10B, the comparison circuit 20 and the integrating capacitor C2.

The transfer function G(S) of the transconductance circuit 10 to collector voltage for this common feedback reference voltage Vref is expressed by the following Equation:

$$G(S) = \frac{(gm1 \cdot gm2 \cdot \gamma_0)/C2}{s + (gm1 \cdot gm2 \cdot \gamma_0)/C2} \quad (1)$$

In this Equation 1, gm1 and gm2 represent transconductances of the comparison circuit 20 consisting of the transistors Q8 and Q9 and the transconductance circuit 10 comprised of the transistors Q1 and Q2. $\gamma_0$ also represents the parallel resistance of the output resistances of the transistors Q1 and Q3, or the transistors Q2 and Q4. S also represents a complex frequency.

As clearly seen from the above Equation 1, the transconductance circuit 10 is stable because the "pole" is in the left half field of S plane when the characteristic is represented on the polar coordinates. Further, as the capacitor C1 is connected between the collectors of the transistors Q1 and Q2, the capacitor C1 acts as equally as a circuit arrangement where two capacitors each having capacitance twice as the capacitance of the capacitor C1 are connected between the collectors of the transistors Q1 and Q2 and the ground potential source GND, respectively. Accordingly, the capacitor C1 have achieved a required capacitance for the transconductance circuit 10 with a small capacitor. Thus the circuit as shown in FIG. 1 is suited for fabricating on IC devices because IC devices are generally inadequate to fabricate thereon a large capacitor.

Thus, the integration filter circuit shown in FIG. 1 has such merits as it is stable and needed capacitance can be made small.

However, there still remains a large problem for implementing such transconductance circuit 10 on IC devices. That is, in physical IC devices parasitic capacitances inevitably exist around both ends of the capacitor C1 due to actual wiring conductors for coupling the capacitor C1 in the IC device. Therefore, when considering the parasitic capacitance Cp, the transfer function G(S) represented by the Equation 1 is changed to the following Equation:

$$G(S) = \frac{(gm1 \cdot gm2)/C2 \cdot Cp}{s^2 + (gm1 \cdot gm2)/C2 \cdot Cp} \quad (2)$$

As seen from the Equation 2, the term of the parallel resistance $\gamma_0$ is eliminated. This is because that the parallel resistance $\gamma_0$, the complex frequency S and the parasitic capacitance Cp have a relation represented by following Equation:

$$\gamma_0 // \frac{1}{Cp \cdot S} \approx \frac{1}{Cp \cdot S} \quad (3)$$

From the Equation 2, the gain G(jω) becomes as follows:

$$G(j\omega) = \frac{(gm1 \cdot gm2)/C2 \cdot Cp}{(gm1 \cdot gm2)/C2 \cdot Cp - \omega^2} \quad (4)$$

As easily seen from this Equation 4, the gain $G(j\omega)$ becomes not only infinite but also unstable when the $\omega$ is given by following Equation:

$$\omega = [(gm1 \cdot gm2)/C2 \cdot Cp]^{\frac{1}{2}} \quad (5)$$

because the denominator of the Equation 4 becomes zero in the condition given by the Equation 5 and the gain $G(j\omega)$ shall go to infinity.

In the above case, if there exists a certain noise in the circuit, the noise is amplified so as to cause an abnormal oscillation in the circuit.

In other words, the reason for the circuit being unstable is due to that the denominator of Equation 2 has a quadratic form as to the complex frequency S. To prevent such an oscillation in the circuit, it is required that the integrating capacitor C2 is sufficiently large and further a resistor is connected to the integrating capacitor C2 in series. Therefore, even when the capacitor C1 could be made small, the integrating capacitor C2 still must be large. Thus devices implementing the conventional integrating filter circuit are difficult to reduced their size due to the problem of the requirement of the large capacitance for the integrating capacitor C2.

As described above, the conventional integrating filter circuit has such a defect that the common feedback operation becomes unstable by parasitic capacitances, and that the circuit is apt to oscillate. That is, when tried to prevent the defect, the merit of the reduction of the size of the capacitor C1 is hidden by the requirement of the large capacitance for the integrating capacitor C2.

SUMMARY OF THE INVENTION

It is, therefore, an object of the present invention to provide an integrating filter circuit which is suited for manufacturing integrated circuits, does not make feedback unstable, and requires no capacitor for the common feedback.

In order to achieve the above object, an integrating filter circuit according to one aspect of the present invention includes a reference potential source for supplying the integrating filter circuit with a prescribed reference potential, a transconductance circuit provided with a differential circuit, a variable current source couple to the differential circuit and output means coupled to the differential circuit for outputting an intermediate voltage of the outputs of the differential circuit, a common feedback loop with a comparison circuit coupled between the output means and the variable current source so as to stabilize the intermediate voltage in reference to a reference voltage supplied to the comparison circuit and capacitors coupled between the variable current source and the reference potential source.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
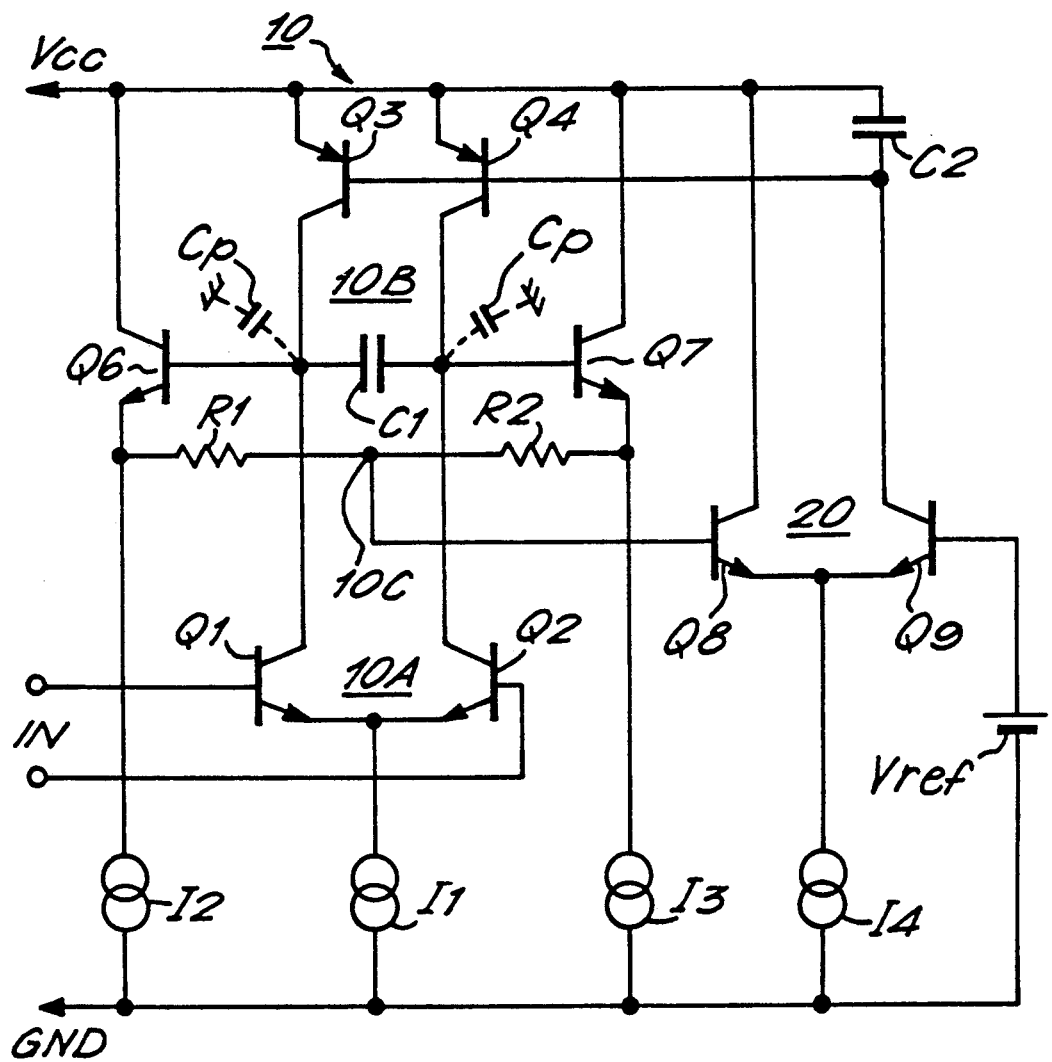
FIG. 1 is a circuit diagram showing a conventional integrating filter circuit.

The present invention will be described in detail with reference to the FIGS. 2 and 3. Throughout the drawings, reference numerals or letters used in FIG. 1 showing the prior art integrating filter circuit will be used to designate like or equivalent elements for simplicity of explanation.

Figure 2:
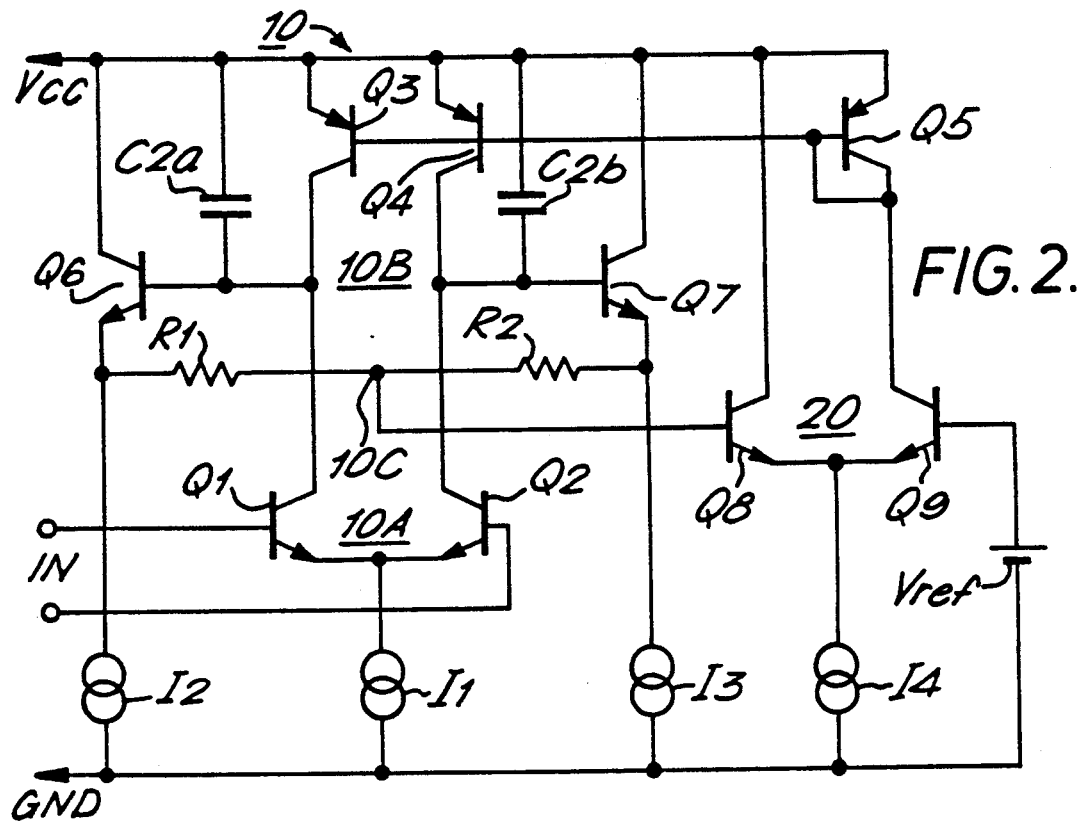
FIG. 2 is a circuit diagram showing a first embodiment of the integrating filter circuit according to the present invention.

Referring now to FIG. 2, a first embodiment of the integrating filter circuit according to the present invention will be described in detail.

In FIG. 2, the embodiment of the integrating filter circuit differs from the conventional integrating filter circuit shown in FIG. 1 in that the integrating capacitor C2 provided within the common feedback loop is omitted. Instead of the integrating capacitor C2, two integrating capacitors C2a and C2b are connected between the current output ends and the source of the power supply voltage Vcc respectively. And then the output terminal of the comparison circuit 20 along the common feedback loop is coupled to the transistors Q3 and Q4 through a transistor Q5 which is arranged in a diode fashion.

In FIG. 2, the transfer function G(S) of the transconductance circuit 10 to the collector voltage for the common feedback reference voltage Vref is expressed by the following Equation:

$$G(S) = \frac{K \cdot gm1/C2a}{s + K \cdot gm1/C2a} \quad (6)$$

wherein it is assumed that the capacitors C2b has the same capacitance as that of the capacitor C2a (i.e., C2b=C2a).

In the above Equation 6, K represents the gain of the variable current source 10B comprised of the transistors Q3, Q4, Q6 and Q7. As clearly seen from the Equation 6, the denominator has a primary form as to the pole frequency S. Thus there exists only one integrating element in the circuit according to the embodiment and the circuit is stable.

Now an effect of parasitic capacitances Cp inevitably existing at the collectors of the transistors Q1 (or Q3) and Q2 (or Q4) and the ground potential source GND on a physical IC device implementing the the circuit according to the embodiment will be discussed. In this physical IC device, the transfer function G(S) of the transconductance circuit 10 to the collector voltage for the common feedback reference voltage Vref does not affect the circuit stability as the capacitance C1a in Equation 6 is replaced by C2a+Cp. This is because that the integrating capacitors C2a and C2b are actually paralleled to the parasitic capacitors Cp as mentioned above. That is, in the embodiment as shown in FIG. 2 the parasitic capacitors Cp are positively utilized as parts of the integrating capacitors (while in the conventional circuit as shown in FIG. 1 these parasitic capacitors badly affected the stability of the circuit). As a result, the embodiment as shown in FIG. 2 can achieve a large capacitance for integration with a relatively small capacitors.

Figure 3:
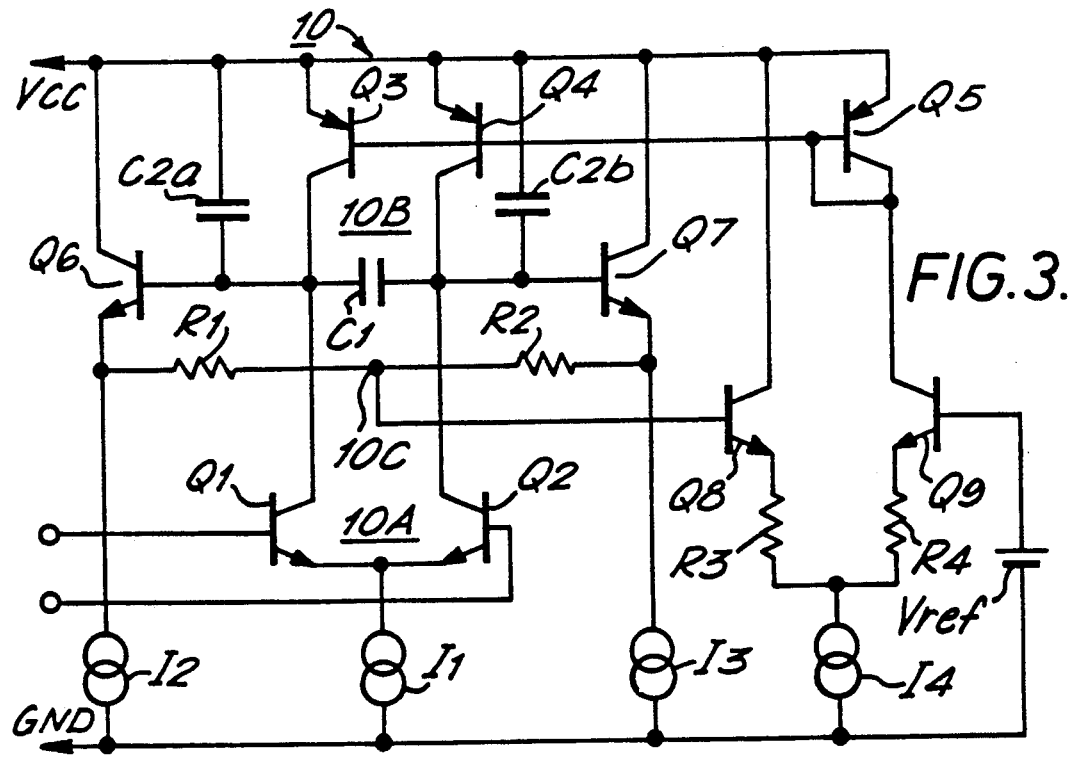
FIG. 3 is a circuit diagram showing another embodiment of the integrating filter circuit according to the present invention.

FIG. 3 shows another embodiment of the integrating filter circuit according to the present invention. The circuit construction of this embodiment differs from that shown in FIG. 2 in that a capacitor C1 is connected between the current output ends of the transconductance circuit 10 and also degeneration resistors R3 and R4 are connected in series to the emitters of the transistors Q8 and Q9 comprising the comparison circuit 20, respectively. These degeneration resistors R3 and R4 effect to reduce the transconductance gm1 of the comparison circuit so as to lower the loop gain of the common feedback loop and thus to invite the reduction of the capacitors for integration filtering.

In the embodiments of FIGS. 2 and 3, each of the integrating capacitors C2a and C2b are coupled to the source of the power supply voltage Vcc. However, these capacitors can be coupled to the ground potential source GND, because the source of the power supply voltage Vcc and the ground potential source GND are communicated with each other at an AC potential.

Further, the present invention is able to applied to not only to the embodiments as shown in FIGS. 2 and 3, but also to other transconductance circuits, comparison circuit 20s, variable current source 10Bs, etc. That is, the present invention can provide a unique integrating filter circuit in which capacitors for common feedback loops are also utilized as integrating capacitors for filtering operation.

As described above, the present invention can provide an extremely preferable integrating filter circuit.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. An integrating filter circuit comprising:
   a reference potential source for supplying the integrating filter circuit with a prescribed reference potential;
   a transconductance circuit provided with a differential circuit, a variable current source directly coupled to first and second outputs of the differential circuit and node means coupled to the variable current source for outputting an intermediate voltage of the differential circuit;
   a common feedback loop with a comparison circuit coupled between the node means and the variable current source so as to stabilize the intermediate voltage in reference to a reference voltage supplied to the comparison circuit;
   capacitors coupled between the variable current source and the reference potential source; and
   another capacitor coupled between the first and second outputs of the differential circuit.

2. An integrating filter circuit as claimed in claim 1, wherein the comparison circuit comprises another differential circuit constructed with a pair of transistors whose emitters are commonly connected via a series of degeneration resistors; and said emitters are further coupled to a second potential source to the reference potential source.

3. The integrating filter circuit of claim 1, wherein the differential circuit comprises a pair of transistors having emitters that are coupled to another reference potential source.

4. An integrating filter circuit comprising:
   a reference potential source;
   a transconductance circuit including a differential circuit,
   a variable current source coupled to first and second outputs of the differential circuit, and
   node means coupled to the variable current source;
   a common feedback loop coupled between the node means and the variable current source,
   the common feedback loop comprising
      a comparison circuit including a pair of transistors arranged in a differential circuit configuration, each transistor including an emitter and a collector, the transistors being arranged in a common-emitter circuit configuration; and
      a feedback transistor including a collector and a base, and being configured as a diode, the collector of the feedback transistor being connected to the collector of one of the transistors of the pair of comparison circuit transistors, and the base of the feedback transistor being connected to the variable current source; and
   capacitors coupled between the variable current source and the reference potential source.

5. The integrating filter circuit of claim 4, wherein the differential circuit of the transconductance circuit comprises:
   a pair of transistors, each transistor including an emitter and a collector, the emitters being commonly connected in a common-emitter circuit configuration, and the collectors being coupled to the variable current source.

6. The integrating filter circuit of claim 4, wherein the variable current source comprises:
   first and second pairs of transistors, each transistor including an emitter, a collector, and a base;
   the first pair of transistors being arranged in a common-collector circuit configuration;
   the second pair of transistors being arranged in a common-emitter circuit configuration;
   the collector of one of the transistors of the second pair of transistors being connected to the base of one of the transistors of the first pair of transistors and to the differential circuit of the transconductance circuit; and
   the collector of the other of the transistors of the first pair of transistors being connected to the base of the other of the transistors of the first pair of transistors and to the differential circuit of the transconductance circuit.

7. The integrating filter circuit of claim 6, further including a plurality of resistors connected in series, the emitters of the first pair transistors being coupled via the plurality of resistors.

8. The integrating filter circuit of claim 7, wherein the node means comprises a connection of the plurality of resistors, the plurality of resistors including two resistors of equal value.

9. An integrating filter circuit of claim 4, further including another capacitor coupled between the first and second outputs of the differential circuit of said transconductance circuit.

* * * * *